(12) United States Patent
Duewer et al.

(10) Patent No.: US 8,581,756 B1
(45) Date of Patent: Nov. 12, 2013

(54) SIGNAL-CHARACTERISTIC DETERMINED DIGITAL-TO-ANALOG CONVERTER (DAC) FILTER STAGE CONFIGURATION

(71) Applicant: Cirrus Logic, Inc., Austin, TX (US)

(72) Inventors: Bruce Duewer, Austin, TX (US); Gautham Devendra Kamath, Austin, TX (US)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 13/628,805

(22) Filed: Sep. 27, 2012

(51) Int. Cl.
*H03M 7/00* (2006.01)

(52) U.S. Cl.
USPC .............................. 341/61; 341/143; 341/144

(58) Field of Classification Search
USPC .................................... 341/61, 143
See application file for complete search history.

(56) References Cited

U.S. PATENT DOCUMENTS

| | | | |
|---|---|---|---|
| 3,587,044 A | 6/1971 | Jenkins | |
| 3,676,583 A | 7/1972 | Morita et al. | |
| 4,092,596 A | 5/1978 | Dickinson et al. | |
| 4,803,638 A | 2/1989 | Nottingham et al. | |
| 4,819,196 A | 4/1989 | Lilley et al. | |
| 5,016,269 A | 5/1991 | Rogers | |
| 5,126,686 A | 6/1992 | Tam | |
| 5,220,678 A | 6/1993 | Feei | |
| 5,422,760 A | 6/1995 | Abbott et al. | |
| 5,623,533 A | 4/1997 | Murakami et al. | |
| 5,748,126 A * | 5/1998 | Ma et al. ........................ | 341/143 |
| 5,872,810 A | 2/1999 | Philips et al. | |
| 5,880,837 A | 3/1999 | Roberts | |
| 5,912,920 A | 6/1999 | Marchok et al. | |
| 5,982,833 A | 11/1999 | Waters | |
| 6,055,418 A | 4/2000 | Harris et al. | |
| 6,108,561 A | 8/2000 | Mallinkrodt | |
| 6,134,214 A | 10/2000 | Takagi et al. | |
| 6,178,215 B1 | 1/2001 | Zhang et al. | |
| 6,215,423 B1 * | 4/2001 | May et al. ........................ | 341/61 |
| 6,215,816 B1 | 4/2001 | Gillespie et al. | |
| 6,243,399 B1 | 6/2001 | Kaewell et al. | |
| 6,252,454 B1 | 6/2001 | Thompson et al. | |
| 6,282,045 B1 | 8/2001 | Glover | |
| 6,304,615 B1 | 10/2001 | Webster | |
| 6,334,174 B1 | 12/2001 | Delp et al. | |
| 6,377,076 B1 | 4/2002 | Gauthier | |

(Continued)

OTHER PUBLICATIONS

Dwivedi, et al., "Traffic Model for USA Long-distance Optical Network", Optical Fiber Communication Conference, 2000, vol. 1, pp. 156-158.

(Continued)

*Primary Examiner* — Khai M Nguyen
(74) *Attorney, Agent, or Firm* — Andrew Mitch Harris; Mitch Harris, Atty at Law

(57) ABSTRACT

A digital signal processing circuit, such as a digital-to-analog converter (DAC) having multiple cascaded processing stages, some of which are selectably placed in a low-power non-operating state according to a lower-power operating mode of the digital signal processing circuit and are placed in an operating state according to another higher-performance operating mode of the circuit. The output sample rates of the stages differ, so that the sample rate through the cascade changes. A signal characteristic determination block generates an indication of one or both of an amplitude and/or frequency of the input signal, so that the operating mode of the digital signal processing circuit is selected in conformity with the indication of amplitude and/or frequency of the input signal.

20 Claims, 3 Drawing Sheets

(56) References Cited

U.S. PATENT DOCUMENTS

| | | |
|---|---|---|
| 6,389,069 B1 | 5/2002 | Mathe |
| 6,549,604 B2 | 4/2003 | Shenoi |
| 6,580,930 B1 | 6/2003 | Fulghum et al. |
| 6,633,178 B2 | 10/2003 | Wilcox et al. |
| 6,798,881 B2 | 9/2004 | Thomasson |
| 6,810,216 B1 | 10/2004 | Tourunen |
| 6,888,482 B1 | 5/2005 | Hertle |
| 6,970,010 B2 | 11/2005 | Wilcox et al. |
| 7,030,660 B2 | 4/2006 | Hanneberg et al. |
| 7,283,076 B1 | 10/2007 | Ding et al. |
| 7,353,007 B2 | 4/2008 | Carballo et al. |
| 7,365,667 B1 | 4/2008 | Nanda et al. |
| 7,477,178 B1 | 1/2009 | Drakshapalli et al. |
| 7,714,750 B2 * | 5/2010 | Chang et al. .......... 341/61 |
| 8,271,055 B2 | 9/2012 | Carballo |
| 2003/0114205 A1 | 6/2003 | Yamashita |
| 2004/0128416 A1 | 7/2004 | Kurts et al. |
| 2004/0203483 A1 | 10/2004 | Carballo |

OTHER PUBLICATIONS

Mehta, et al., "Fixed Sensor Networks for Civil Infrastructure Monitoring—An Initial Study", Dept. of ICS, UC Irvine, Aug. 2002, pp. 1-12.

Mehta, et al., "Fixed Sensor Networks for Civil Infrastructure Monitoring—An Initial Study", Aug. 2002, pp. 1-12, Dept. of ICS, UC Irvine.

* cited by examiner

SIGNAL-CHARACTERISTIC DETERMINED DIGITAL-TO-ANALOG CONVERTER (DAC) FILTER STAGE CONFIGURATION

BACKGROUND OF THE INVENTION

1. Field of the Invention

The present invention relates generally to digital signal processing circuits, including digital-to-analog converters (DACs), and more specifically, to a DAC having filter stages having a selected configuration determined by characteristics of the signal being processed.

2. Background of the Invention

Oversampling DAC circuits typically use filters to generate the final analog signal from the oversampled digital input(s). Such topologies are used widely in DACs such as delta-sigma modulator based DAC integrated circuits, in which conversion of a digital value to an analog signal is accomplished by interpolating the output of the delta-sigma modulator through a series of filter stages. The filtering action is applied to meet certain noise floor requirements at each stage, so that the final output of the filter provides the specified suppression of noise in the generated analog signal.

Typically, the longer and more complex the filter, the better the noise performance of the DAC, but longer and more complex filters have higher power requirements. Since many DACs are employed in battery-powered devices, such as wireless telephones and personal audio players, balancing of power requirements with system performance is necessary.

Therefore, it would be desirable to provide a digital signal processing circuit that has a series of filter stages, in which power consumption can be balanced with noise performance.

SUMMARY OF THE INVENTION

The above stated objectives, as well as others, are achieved in a digital signal processing circuit, which may be a digital-to-analog converter (DAC), and its method of operation.

The digital signal processing circuit includes a cascade of multiple stages that process an input signal, in which the output sample rate of the stages differ, so that the sample rate through the cascade changes. A signal characteristic determination block generates an indication of one or both of an amplitude and/or frequency of the input signal, so that an operating mode of the digital signal processing circuit is selected in conformity with the indication of amplitude and/or frequency of the input signal. In a lower-power operating mode, one or more of the stages, but not all of the stages, are placed in a low-power non-operating state to conserve power, and in another higher-performance operating mode, the one or more stages is placed in an operating state to increase performance.

The foregoing and other objectives, features, and advantages of the invention will be apparent from the following, more particular, description of the preferred embodiment of the invention, as illustrated in the accompanying drawings.

DESCRIPTION OF ILLUSTRATIVE EMBODIMENT

The present invention encompasses digital signal processing circuits in which input signal characteristics are used to select an operating mode from among multiple operating modes. Among the operating modes is at least a lower-power operating mode in which one or more, but not all, of a cascade of digital signal processing blocks having different output sample rates is disabled to decrease power consumption. In a higher-performance operating mode, the one or more digital signal processing blocks is enabled. The input signal characteristics that are measured may include signal amplitude, signal frequency or both.

Figure 1:
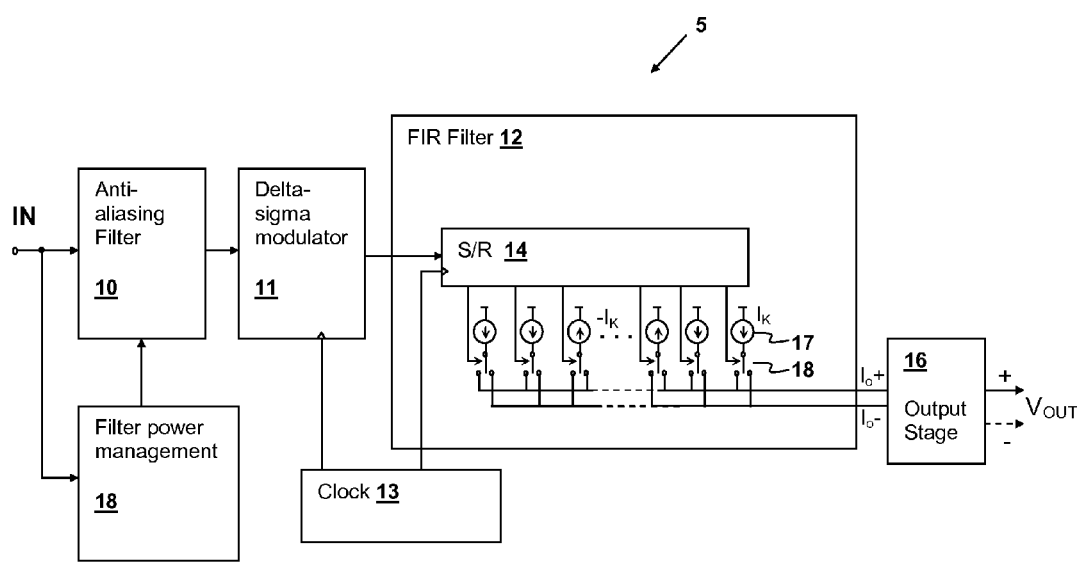
FIG. 1 is a block diagram of an exemplary DAC 5.

FIG. 1 shows an exemplary digital analog converter (DAC) 5. While DAC 5 provides an example of a circuit in which operating modes are selected according to input signal characteristics as described above, it is understood that the techniques disclosed herein may be applied to other types of circuits, including audio codecs. An anti-aliasing filter 10 receives digital input values at an input IN and processes those values to provide an up-sampled input to a delta-signal modulator 11, which generates a noise-shaped output that is provided to a finite impulse response (FIR) filter 12. Delta-sigma modulator 11 is operated by a sampling clock 13 that also provides an input to FIR filter 12. FIR filter 12 may be one of multiple parallel filters used to implement a DAC for improved matching, or may implement a single filter. The output of FIR filter 12 is provided to an output stage 16 that converts the differential current provided by a set of tap current sources 17 into a voltage output. Alternatively, output stage 16 may be a current mirror or current amplifier if a current output is required. Each tap constant current 17 has a corresponding switching element 18 that applies the current source output to one of two current summing node outputs $I_o+$ and $I_o-$, which are provided as inputs to output stage 16. The summing node $I_o+$, $I_o-$ to which each current source provides current is selected by the binary value of a corresponding output of a shift register 14 that receives the output of delta-sigma modulator 11. Alternatively, FIR filter 12 may have one or more voltage outputs, which may be supplied by switched capacitor circuits, rather than the switched current sources of the illustrated example.

A filter power management block 18 receives values representative of the digital input values provided to input IN, which in the illustrated example is taken directly from input IN, but may be taken from other nodes within anti-aliasing filter 10 or from other locations, such as the upstream decoding information available in a codec circuit. Filter power management block 18 measures signal characteristics, such as the amplitude and/or frequency of the digital input values provided to input IN and generates one or more control signals that control an operating mode of anti-aliasing filter 10. Depending on the characteristics of the input signal represented by the digital input values provided to input IN, power consumed by anti-aliasing filter 10 can be conserved. For example, when the input signal is unchanging, i.e., there is no frequency content at all, anti-aliasing filter 10 can be effectively bypassed, e.g., by freezing its output value. Under other conditions, such as low input signal amplitude, the amount of processing performed by anti-aliasing filter 10 can be reduced, which also reduces the power consumed by anti-aliasing filter 10.

Figure 2A:
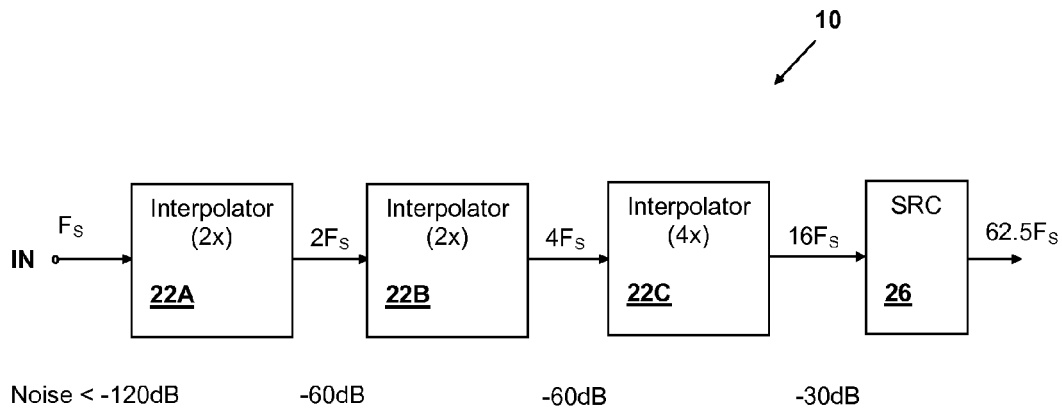
FIGS. 2A-2C are block diagrams illustrating an anti-aliasing filter 10 within DAC 5 of FIG. 1, in various modes of operation.
Figure 2B:
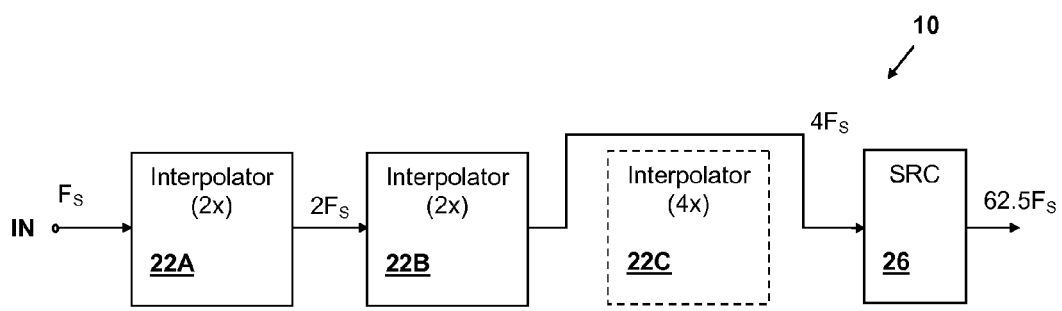
Figure 2C:
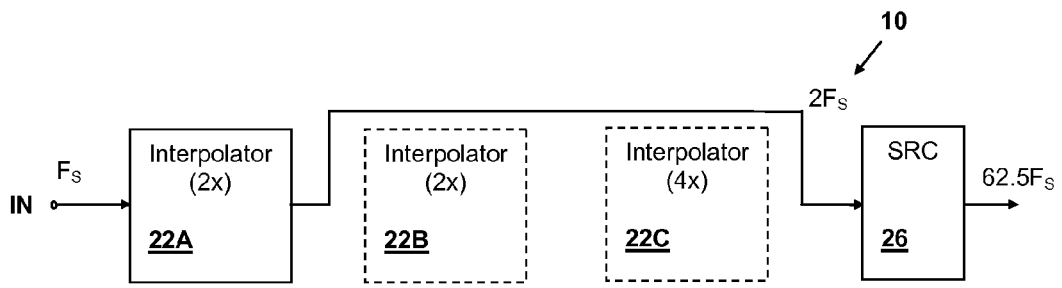

FIGS. 2A-2C illustrate various operating modes of anti-aliasing filter 10. FIG. 2A shows anti-aliasing filter 10 with all internal blocks operational. Anti-aliasing filter 10 includes a cascade of interpolators 22A-22C that are digital signal processing stages operated at progressively increasing output rates, but have progressively decreasing complexity. For example, interpolator 22A is generally the highest order interpolator: e.g., 11th order, while interpolator 22C has the lowest order, e.g., 3rd order, and interpolator 22B will have an order somewhere between that of interpolators 22A and 22C, e.g., 7th order. In the example, interpolators 22A-22C have up-sampled outputs, so that the output rates of interpolators 22A and 22B are double their input rates and the output rate of interpolator 22C is four times its input rate. Reducing the overall interpolation order of the cascade of interpolators 22A-22C increases error in the representation of the input signal provided to the input of a sample rate converter (SRC) 26, which appears as noise in the output signal. SRC 26, converts the output of the cascade of interpolators 22A-22C to the desired output sample rate. An exemplary set of floors for introduced noise is shown in FIG. 2A, so that noise introduced at the input is below −120 dB of signal maximum, at the output of interpolator 22A the introduced noise is below −60 dB and so forth. If the input signal amplitude is low and/or the frequency content of the input signal is low, the amount of interpolation needed to hold the "noise" introduced by the processing is reduced, as is the sample rate needed to effectively represent the signal.

In order to conserve power, when signal amplitude and/or frequency content is low, one or more of interpolators 22A-22C can be disabled and bypassed in one or more low-power operating modes. FIG. 2B illustrates one such operating mode in which interpolator 22C is bypassed. The resulting operation saves the power that would otherwise be consumed by interpolator 22C, and even more significantly, reduces the power consumed by SRC 26 because the rate at which the input of SRC 26 operates has been reduced by a factor of 4. An example of an SRC 26 in which the reduction in input sample rate results in power savings is given by U.S. Pat. No. 7,283, 076 entitled "DIGITAL NON-INTEGER SAMPLE/HOLD IMPLEMENTED USING VIRTUAL FILTERING", the disclosure of which is incorporated by reference, but other types of SRCs can also be used in the illustrated example. Therefore, bypassing interpolator 22C results in a reduction of the downstream sample rate to the input of SRC 26 by a factor of four, yielding an approximate reduction in power by a factor of two. FIG. 2C illustrates yet another low power operating mode of anti-aliasing filter 10, which is the operating mode having the lowest power consumption from among the operating modes, in which both interpolators 22B and 22C are bypassed and disabled, yielding a reduction in downstream sample rate by a factor of eight.

Figure 3:
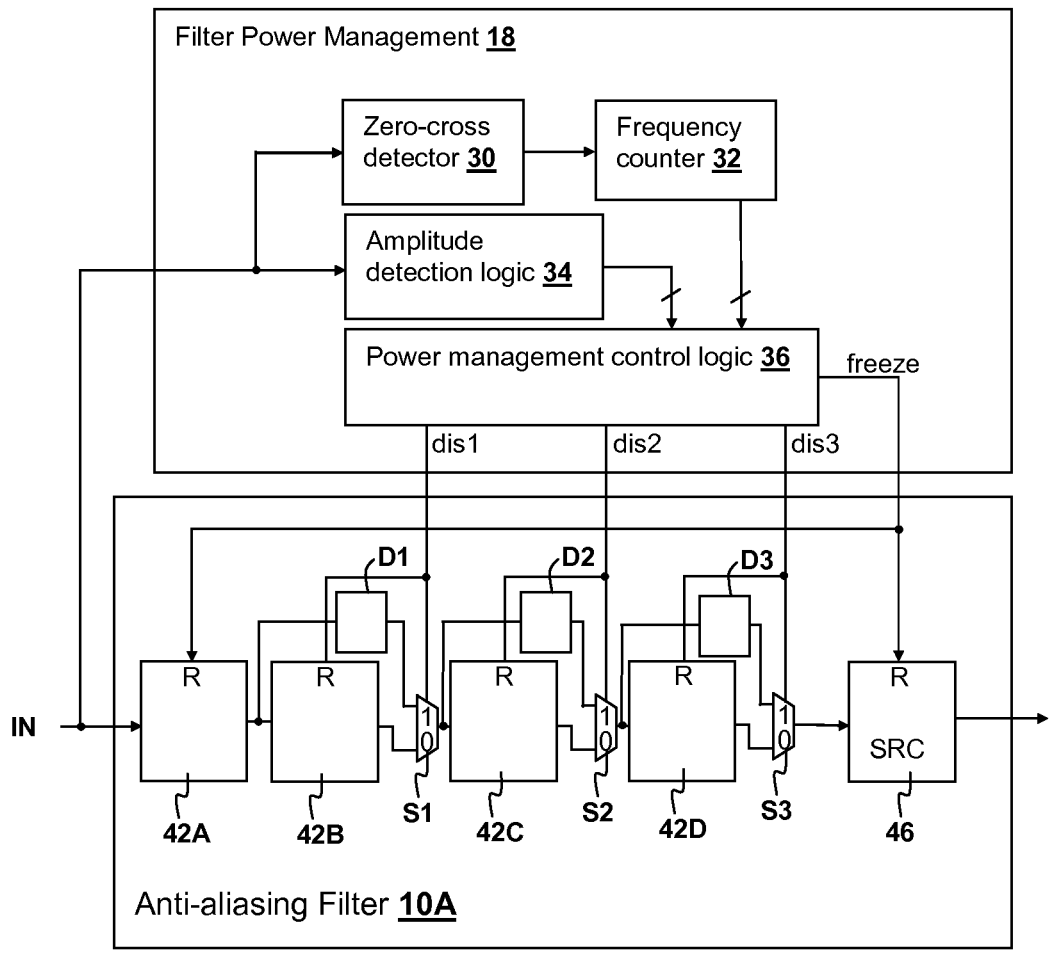
FIG. 3 is a block diagram showing details of filter configuration control 18 of FIG. 1 coupled to another exemplary anti-aliasing circuit 10A that can be used in place of anti-aliasing circuit 10 in FIG. 1.

FIG. 3 shows another exemplary anti-aliasing filter 10A that may be used in place of anti-aliasing filter 10 in DAC 5 of FIG. 1. Anti-aliasing filter 10A is coupled to filter power management block 18, which also receives the values provided to input IN. Filter power management block 18 includes zero-cross detector 30, which detects when the input values cross their midpoint and a frequency counter 32 that accumulates zero-crossings to determine when the frequency content of the input signal is below one or more thresholds. Frequency counter 32 is generally reset periodically so that the count value of frequency counter 32 is representative of average frequency content of the input signal. Filter power management block 18 also includes amplitude detection logic 34, which detects when the input values cross one or more amplitude thresholds. A power management control logic block 36 enables and disables interpolators 42B, 42C and 42D, by asserting and de-asserting corresponding disable signals dis1-dis3 depending on the frequency and/or amplitude content of the input signal. The disabled state of interpolators 42A-42D is provided in the example by asserting the reset input, which disables internal clocking and clears any internal state, but other techniques for disabling interpolators 42A-42D can be used, including disabling power. Each of interpolators 42B-42D has a corresponding output multiplexor S1, S2 and S3, which, when the corresponding interpolator 42B-42D is disabled, couples the input signal to the corresponding interpolator 42B-42D to the input of the next interpolator through a corresponding delay D1-D3 that is matched to the delay of the corresponding one of interpolators 42B-42D. Interpolator 42A is only disabled when the input signal is unchanging, and under those circumstances, the output of anti-aliasing filter is frozen according to a control signal freeze provided from power management control logic block 36, disabling operation of all internal blocks, rather than bypassing interpolator 42A. Control signal freeze also halts operation of SRC 46, since the input signal value is unchanging while control signal freeze is asserted.

As mentioned above, the criteria for determining whether any lower power operating mode can be selected, and for determining which lower power operating mode to select can be based on input signal frequency, amplitude, or both. For frequency-only or amplitude-only criteria the decision points can be thresholds based on the number of counts in frequency counter 32 or the recent signal levels detected by amplitude detection logic 34, but for combined frequency/amplitude criteria, the algorithms will generally be more complex. For low frequency content and higher signal level, there may still be a possibility of achieving performance goals without enabling all of interpolators 44A-44D and similarly for low signal level with higher frequency content, and thus the information provided by both frequency counter 32 and amplitude detection logic 34 may be used advantageously to select the operating mode having the least power consumption while still achieving the desired noise performance. The thresholds for selecting the operating modes can be predetermined to enforce a "noise" limit at each stage, which is generally a limit on image amplitude in the resulting output signal. Then the filter stage(s) having selectable power consumption can have a lower amount of attenuation when the amplitude and/or frequency of the corresponding input signal is below the threshold value. Power management control logic 36 will generally also apply time delays before applying changes and hysteresis to the selection criteria so that the operating modes specified by control signals dis0-dis2 and control signal freeze are not constantly changing for edge conditions.

While the invention has been particularly shown and described with reference to the preferred embodiments thereof, it will be understood by those skilled in the art that the foregoing and other changes in form and details may be made therein without departing from the spirit and scope of the invention.

What is claimed is:

1. A reconfigurable signal processing circuit for processing an input signal, comprising:
   a detector for generating a measure of at least one of an amplitude or a frequency of the input signal;
   a plurality of digital processing stages connected in cascade for processing the input signal, wherein the plurality of processing stages have differing output sample rates while operational; and
   a power management block for receiving the measure generated by the detector and determining particular ones of the plurality of digital signal processing stages that are placed in a low-power non-operational state in conformity with the measure of amplitude or frequency, whereby in at least one operating mode, when the measure indicates that the amplitude of the input signal or the frequency of the input signal is below a threshold value, at least one but not all of the plurality of digital signal processing stages is placed in the low-power non-operational state, and wherein when the measure indicates that the amplitude of the input signal or the frequency of the input signal is above the threshold value, the at least one digital signal processing stage is placed in an operational state to provide a higher performance from the plurality of digital signal processing stages.

2. The reconfigurable signal processing circuit of claim 1, wherein the plurality of digital signal processing stages implements at least one filter, and wherein the threshold value is predetermined such that an absolute image amplitude limit is enforced by permitting the at least one filter to have a lower amount of attenuation when the at least one of an amplitude or a frequency of the input signal is below the threshold value.

3. The reconfigurable signal processing circuit of claim 1, wherein the plurality of digital signal processing stages comprises a plurality of interpolators coupled in cascade.

4. The reconfigurable signal processing circuit of claim 3, wherein the plurality of digital signal processing stages comprises a sample rate converter that receives an input from an output of the plurality of interpolators.

5. The reconfigurable signal processing circuit of claim 4, wherein the detector further determines whether the input signal is constant from the measure, and wherein the power management block further disables the sample rate converter when the detector determines that the input signal is constant.

6. The reconfigurable signal processing circuit of claim 1, wherein the detector generates a first measure of the frequency of the input signal and a second measure of the amplitude of the input signal.

7. The reconfigurable signal processing circuit of claim 1, wherein the detector generates a first measure of the frequency of the input signal from a count of zero-crossings of the input signal.

8. The reconfigurable signal processing circuit of claim 1, wherein the reconfigurable signal processing circuit is a digital-to-analog converter.

9. A method of processing an input signal, comprising:
generating a measure of at least one of an amplitude or a frequency of the input signal;
operating a plurality of digital signal processing stages connected in cascade for processing the input signal at differing output sample rates; and
power managing the plurality of digital signal processing stages in conformity with the measure generated by generating by determining particular ones of the plurality of digital signal processing stages to be placed in a low-power non-operational state, whereby in at least one operating mode, when the measure indicates that the amplitude of the input signal or the frequency of the input signal is below a threshold value, at least one but not all of the plurality of digital signal processing stages is placed in the low-power non-operational state, and wherein when the measure indicates that the amplitude of the input signal or the frequency of the input signal is above the threshold value, the at least one digital signal processing stage is placed in an operational state to provide a higher performance from the plurality of digital signal processing stages.

10. The method of claim 9, wherein the providing a plurality of digital signal processing stages provides at least one filter within the cascade of digital signal processing stages, and wherein the threshold value is predetermined such that an absolute image amplitude limit is enforced by permitting the at least one filter to have a lower amount of attenuation when the at least one of an amplitude or a frequency of the input signal is below the threshold value.

11. The method of claim 9, wherein the providing a plurality of digital signal processing stages provides a plurality of interpolators coupled in cascade.

12. The method of claim 11, wherein the plurality of digital signal processing stages comprises a sample rate converter that receives an input from an output of the plurality of interpolators.

13. The method of claim 12, wherein the generating further comprises determining whether the input signal is constant from the measure, and wherein the power managing further disables the sample rate converter when the determining determines that the input signal is constant.

14. The method of claim 9, wherein the generating generates a first measure of the frequency of the input signal and a second measure of the amplitude of the input signal.

15. The method of claim 9, wherein the generating generates a first measure of the frequency of the input signal from a count of zero-crossings of the input signal.

16. The method of claim 9, wherein the plurality of digital signal processing stages are stages of a digital-to-analog converter.

17. An integrated circuit, comprising:
a detector for generating a measure of at least one of an amplitude or a frequency of an input signal;
a plurality of digital processing stages connected in cascade for processing the input signal, wherein the plurality of processing stages have differing output sample rates while operational; and
a power management block for receiving the measure generated by the detector and determining particular ones of the plurality of digital signal processing stages that are placed in a low-power non-operational state in conformity with the measure of amplitude or frequency, whereby in at least one operating mode, when the measure indicates that the amplitude of the input signal or the frequency of the input signal is below a threshold value, at least one but not all of the plurality of digital signal processing stages is placed in the low-power non-operational state, and wherein when the measure indicates that the amplitude of the input signal or the frequency of the input signal is above the threshold value, the at least one digital signal processing stage is placed in an operational state to provide a higher performance from the plurality of digital signal processing stages.

18. The integrated circuit of claim 17, wherein the plurality of digital signal processing stages implements at least one filter, and wherein the threshold value is predetermined such that an absolute image amplitude limit is enforced by permitting the at least one filter to have a lower amount of attenuation when the at least one of an amplitude or a frequency of the input signal is below the threshold value.

19. The integrated circuit of claim 17, wherein the plurality of digital signal processing stages comprises a plurality of interpolators coupled in cascade.

20. The integrated circuit of claim 19, wherein the plurality of digital signal processing stages comprises a sample rate converter that receives an input from an output of the plurality of interpolators.

* * * * *